(12) United States Patent
Chan et al.

(10) Patent No.: US 6,597,190 B2
(45) Date of Patent: Jul. 22, 2003

(54) METHOD AND APPARATUS FOR TESTING ELECTRONIC DEVICES

(75) Inventors: Kok Hong Chan, Penang (MY); Chu Aun Lim, Penang (MY); Tark Wooi Fong, Penang (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/074,498

(22) Filed: Feb. 11, 2002

(65) Prior Publication Data

US 2002/0105349 A1 Aug. 8, 2002

Related U.S. Application Data

(63) Continuation-in-part of application No. 09/675,802, filed on Sep. 29, 2000.

(51) Int. Cl.[7] ................................................ G01R 31/02
(52) U.S. Cl. ........................ 324/761; 324/754; 324/755; 324/763
(58) Field of Search ................................ 324/754, 760, 324/761, 755, 750, 731, 762, 158.1; 361/88; 439/68, 70, 482; 350/331; 257/692, 700, 697, 773; 73/855

(56) References Cited

U.S. PATENT DOCUMENTS

| 5,221,209 A | | 6/1993 | D'Amico |
| 5,290,193 A | | 3/1994 | Goff et al. |
| 5,307,012 A | | 4/1994 | Bhattacharyya et al. |
| 5,672,981 A | * | 9/1997 | Dehrman .................... 324/760 |
| 5,721,495 A | | 2/1998 | Jennion et al. |
| 5,923,176 A | | 7/1999 | Porter et al. |
| 5,933,309 A | * | 8/1999 | Smith .......................... 361/88 |
| 5,945,837 A | | 8/1999 | Fredrickson |
| 6,046,597 A | | 4/2000 | Barabi |
| 6,049,217 A | | 4/2000 | Viswanath et al. |
| 6,342,788 B1 | * | 1/2002 | McAllister ................. 324/754 |

FOREIGN PATENT DOCUMENTS

| DE | 3716240 A1 | 12/1987 |
| EP | 0 498 530 A2 | 12/1992 |

* cited by examiner

Primary Examiner—Kamand Cuneo
Assistant Examiner—Trung Q. Nguyen
(74) Attorney, Agent, or Firm—Blakely, Sokoloff, Taylor & Zafman LLP

(57) ABSTRACT

An apparatus for testing electronic devices such as integrated circuits. In one embodiment, an apparatus for testing electronic devices is disclosed that includes a housing such as a test contactor housing which has a plurality of test contactor pins that extend therethrough. The plurality of test contactor pins include a first set of power pins, a second set of ground pins, and a third set of signal pins. A printed circuit board, attached to the housing, has a first ground plane and a first power plane. The power pins are electrically coupled to the first power plane and the ground pins are electrically coupled to the first ground plane. The first set of power pins, the second set of ground pins, and the third set of signal pins extend through the printed circuit board.

15 Claims, 13 Drawing Sheets

METHOD AND APPARATUS FOR TESTING ELECTRONIC DEVICES

CROSS-REFERENCE TO RELATED APPLICATION

The application is a Continuation-In-Part of co-pending application Ser. No. 09/675,802 filed Sep. 29, 2000 by applicants, Kok Hong Chan et al., entitled "A Method and An Apparatus For Testing Electronic Devices."

FIELD

This invention relates generally to testing electronic devices and, more specifically, to a device for testing semiconductor devices.

BACKGROUND

Once an electronic device is manufactured, the electronic device is generally tested to ensure that it is working properly. FIG. 1 illustrates a conventional assembly used to test the performance of an electronic device 120 such as an integrated circuit chip. Assembly 100 includes handler 110, test contactor 130, loadboard 160, and tester 170. Tester 170 supports loadboard 160 and test contactor 130 in order to test electronic device 120. Loadboard 160 serves to electrically couple plurality of pins 150 to tester 170. Handler 110 carries electronic device 120 from an area such as a final test location in a manufacturing area (not shown) and holds electronic device 120 in place while set of contact points 125, such as an array of solder balls at the bottom surface of electronic device 120 contact a corresponding plurality of pins 150 that protrude from test contactor 130.

Plurality of pins 150 includes a set of power pins, a set of ground pins, and a set of signal pins. Signal pins typically carry digital I/O signals such as address bits, control bits, and/or data bits. Power pins provide voltage from a power source (not shown) to set of contact points 125 for testing the performance of electronic device 120. Ground pins generally have ground zero potential to carry the current to ground and prevent the voltage in the power pins from overheating test contactor 130. To prevent a short circuit, power pins are typically isolated from ground pins.

FIG. 2 illustrates a schematic top view of test contactor 130 on loadboard 160. Test contactor 130 includes test contactor housing 210 that surrounds plurality of pins 150. In testing, for example, set of contact points 125 of device 120 by plurality of pins 150, pins may be addressed individually at fast transient times. The nature of the quick addressing of plurality of pins 150 (e.g., power pins coupled to power rails) causes voltage noise that is generally attributable to variations in the power source (not shown). Outside of test contactor housing 210 a plurality of capacitor pads 280 that include a plurality of capacitors (e.g., fifty capacitors) are placed on loadboard 160 for minimizing variations in the external power source.

FIG. 3 illustrates a cross-sectional view of a portion of the assembly of FIG. 1 including a magnified portion of test contactor 130. Test contactor 130 includes test contactor housing 210 that supports elements of test contactor 130, namely plurality of pins 150. Test contactor housing 210 includes a bottom plate typically made of a polymeric or plastic material such as VESPEL® commercially available from E. I. Dupont de Nemours of Wilmington, Delaware. The combination of test contactor 130 and loadboard 160 may be referred to as test interface unit 270 that interfaces with set of contact points 125 of electronic device 120.

Test contactors have generally been unable to adequately resolve several problems associated with testing of the performance of electronic devices. Test contactors typically have high frequency noise and voltage drops in power delivery systems due, in part, to fast switching transients (e.g., pin to pin) and the current consumption associated with electronic device testing. To address the noise considerations, capacitors are added to loadboards. Unfortunately, there is a very limited and a relatively ineffective decoupling area on test loadboards for a comprehensive test tooling decoupling solution (e.g., suitable capacitance to reduce noise). Yet another problem relates to dissipation of the heat generated from plurality of pins 150.

In order to reduce the effects from these problems, modifications have been made to test contactors that affect the cost and quality of test contactors. First, the length of each pin of plurality of pins 150 in test contactor 130 has been reduced from, for example, 7.8 millimeters (mm) or greater to about 3.5 mm. However, by reducing the length of each pin, plurality of pins 150 tend to be less reliable and the cost of test contactor 130 is increased.

Second, conventional test systems use a large quantity of decoupling capacitors such as fifty capacitors on, for example, loadboards. These loadboards are generally already fully populated with pin contacts. The larger number of decoupling capacitors increases the cost of the conventional test systems.

Third, conventional test systems increase the time period in which to test the performance of an electronic device such as an integrated circuit due to factors such as excessive noise. By increasing this time period, the time to produce a functional integrated circuit is also increased. This in turn affects the overall cost of producing integrated circuits. It is therefore desirable to have an apparatus and a method for addressing these disadvantages in the art.

BRIEF DESCRIPTION OF THE DRAWINGS

The invention is illustrated by way of example and not limitation in the figures of the accompanying drawings, in which like references indicate similar elements, and in which.

DETAILED DESCRIPTION

Exemplary embodiments are described with reference to specific configurations. Those of ordinary skill in the art will appreciate the various changes and modifications may be made while remaining within the scope of the appended claims. Additionally, well known elements, devices, components, circuits, process steps and the like are not set forth in detail in order to avoid obscuring the present invention.

Figure 1:
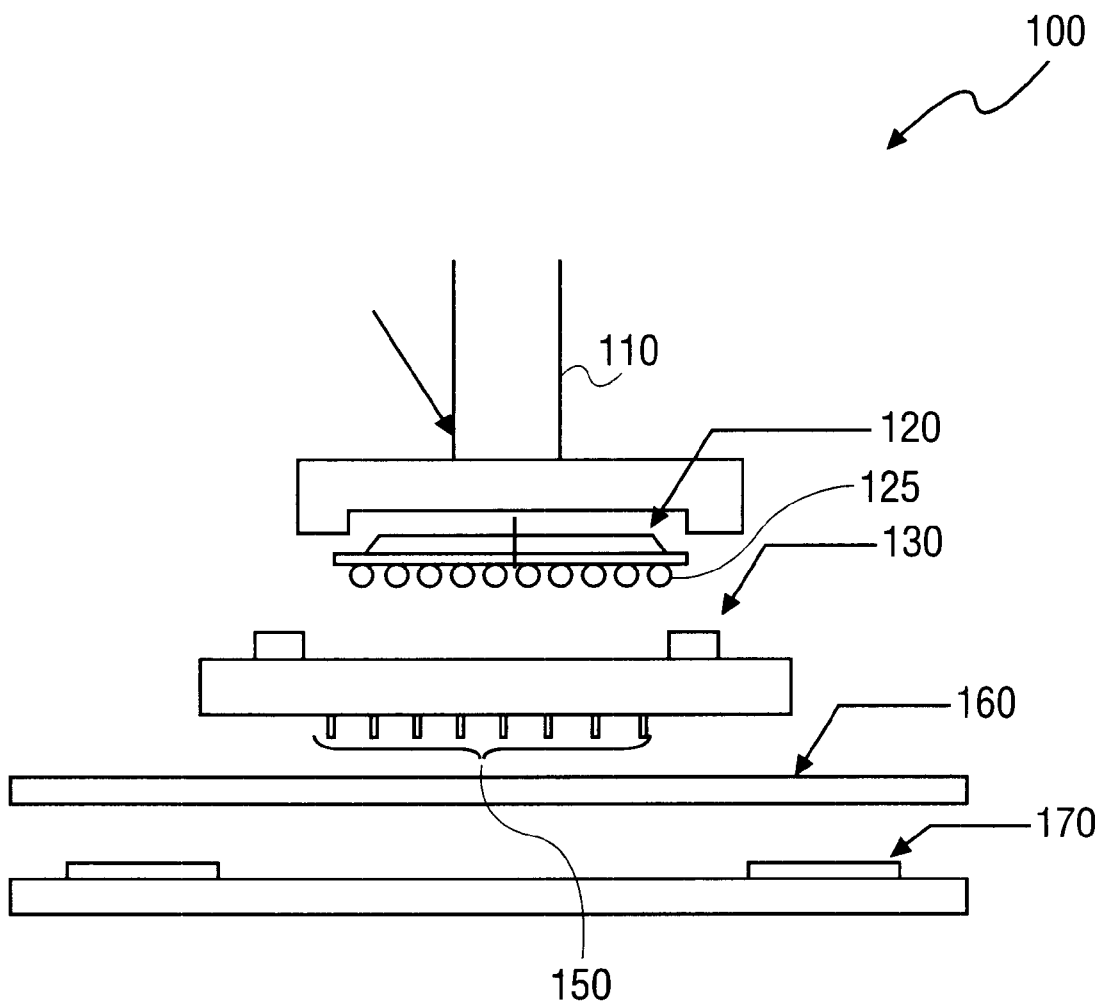
FIG. 1 illustrates a schematic side view of an electronic device testing assembly of the prior art.
Figure 2:
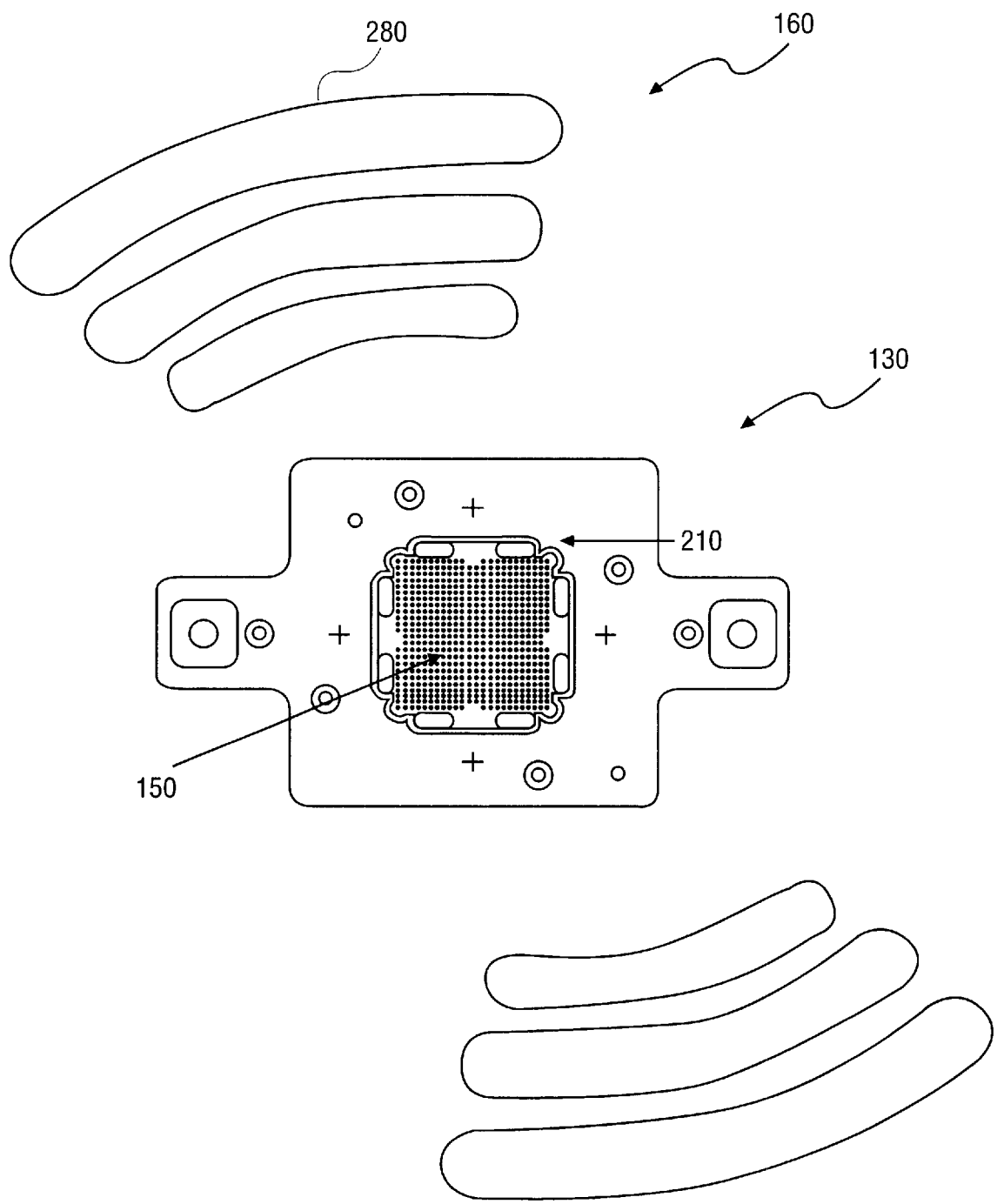
FIG. 2 illustrates a schematic top view of the test contactor and loadboard of FIG. 1.
Figure 3:
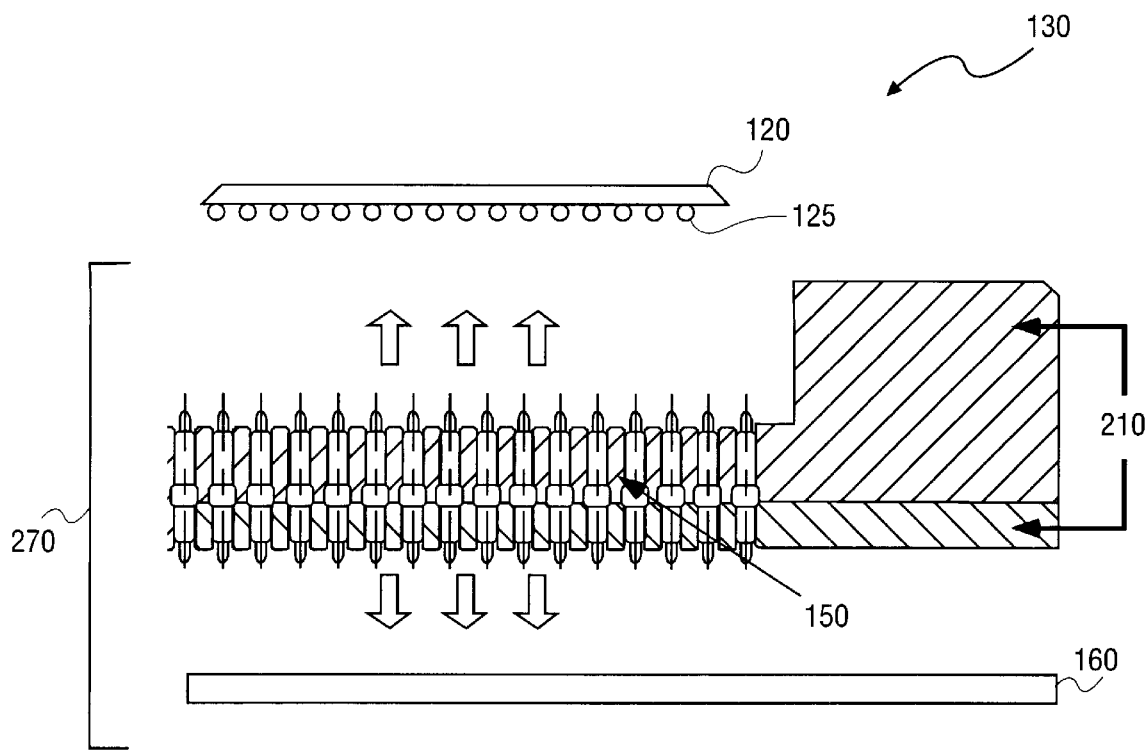
FIG. 3 illustrates a cross-sectional side view of a portion of the testing assembly of FIG. 1.
Figure 4:
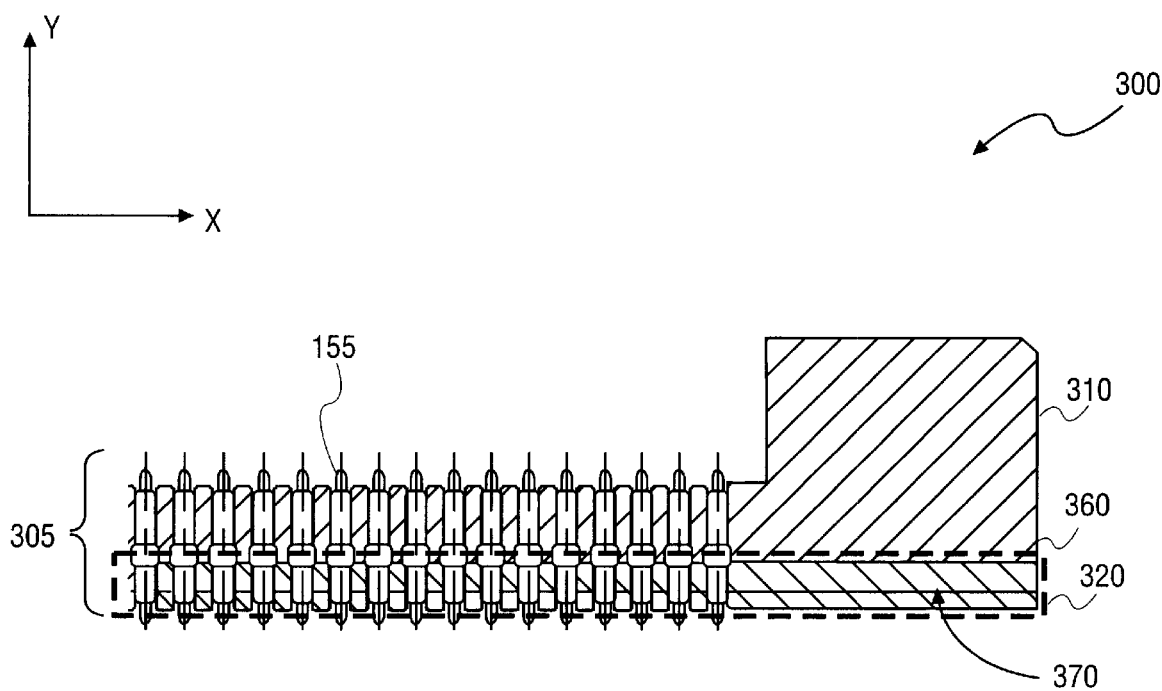
FIG. 4 illustrates a partial cross-sectional view of one embodiment of a testing system including a test contactor.

FIG. 4 illustrates a partial cross-sectional view of one embodiment of a testing system 300. Testing system 300 includes test contactor 305 of test contactor housing 310 and printed circuit board (PCB) 320 shown in ghost lines that may be made of a polymeric or plastic material. In this embodiment, PCB 320 includes at least one power plane 360 and at least one ground plane 370 extending laterally (in an x-direction) through test contactor housing 310. It is appreciated, however, that PCB 320 may include a plurality of power and ground planes.

Apertures located in PCB 320 are configured to receive plurality of pins 155 that include power pins, ground pins, and signal pins. An aperture is slightly larger in diameter than the diameter of a pin in plurality of pins 155. Plurality of pins 155 generally may be longer, cheaper, and more reliable than the state-of-the-art short pins recommended for prior art test contactors. Plurality of pins 155 are coupled, where desired, respectively to power plane 360 and ground plane 370. Pins configured to be coupled to the ground plane are herein referred to as ground pins. Likewise, pins configured to be coupled to the power plane are referred to herein as power pins. Power plane 360 receives power from a power source (not shown) external to test contactor 305. In one embodiment the ground pins, power pins and signal pins extend through the PCB.

Figure 5:
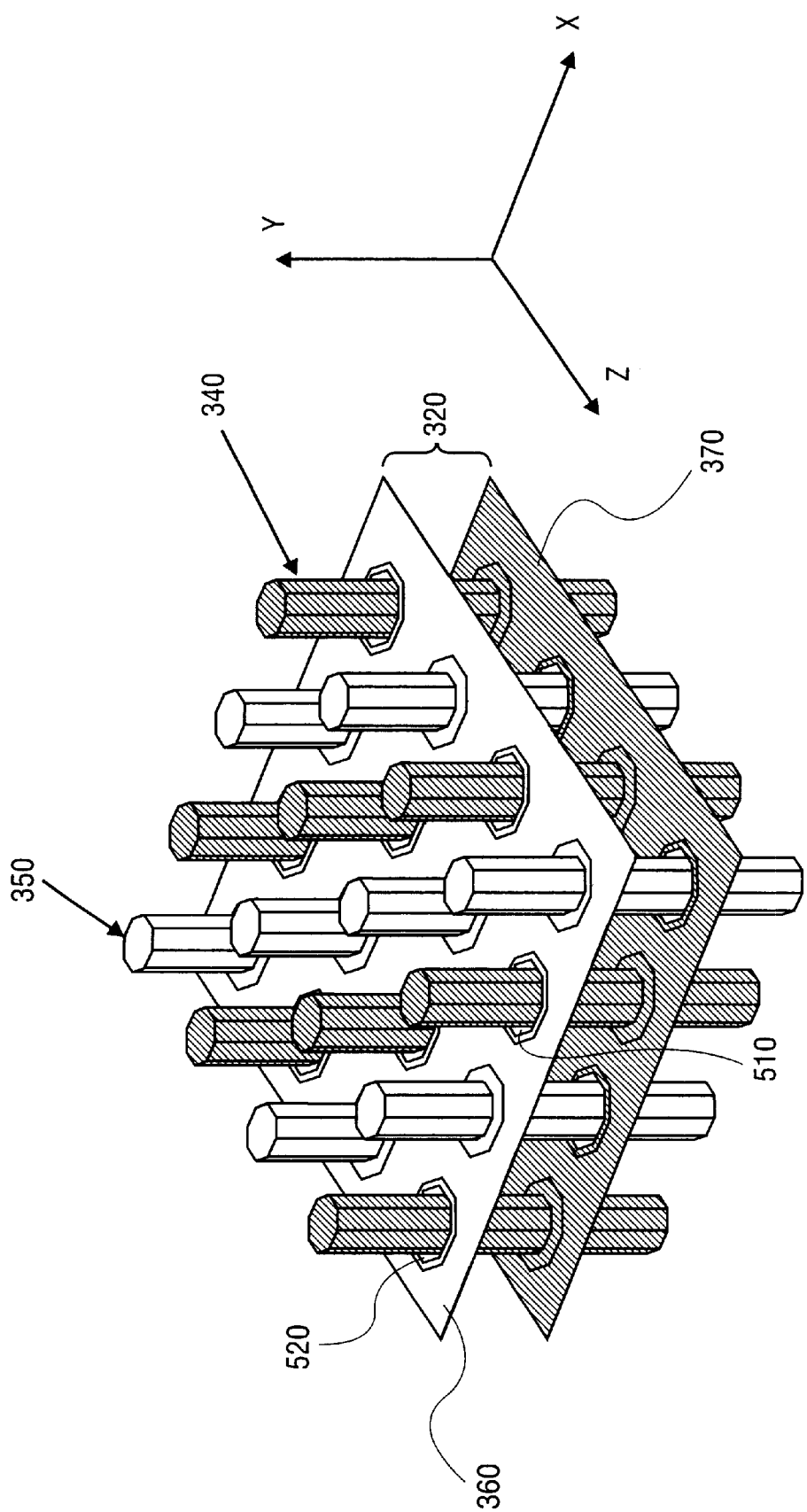
FIG. 5 illustrates a top perspective view of a portion of the test contactor of FIG. 4 and shows a ground plane and ground pins extending therethrough.
Figure 6:
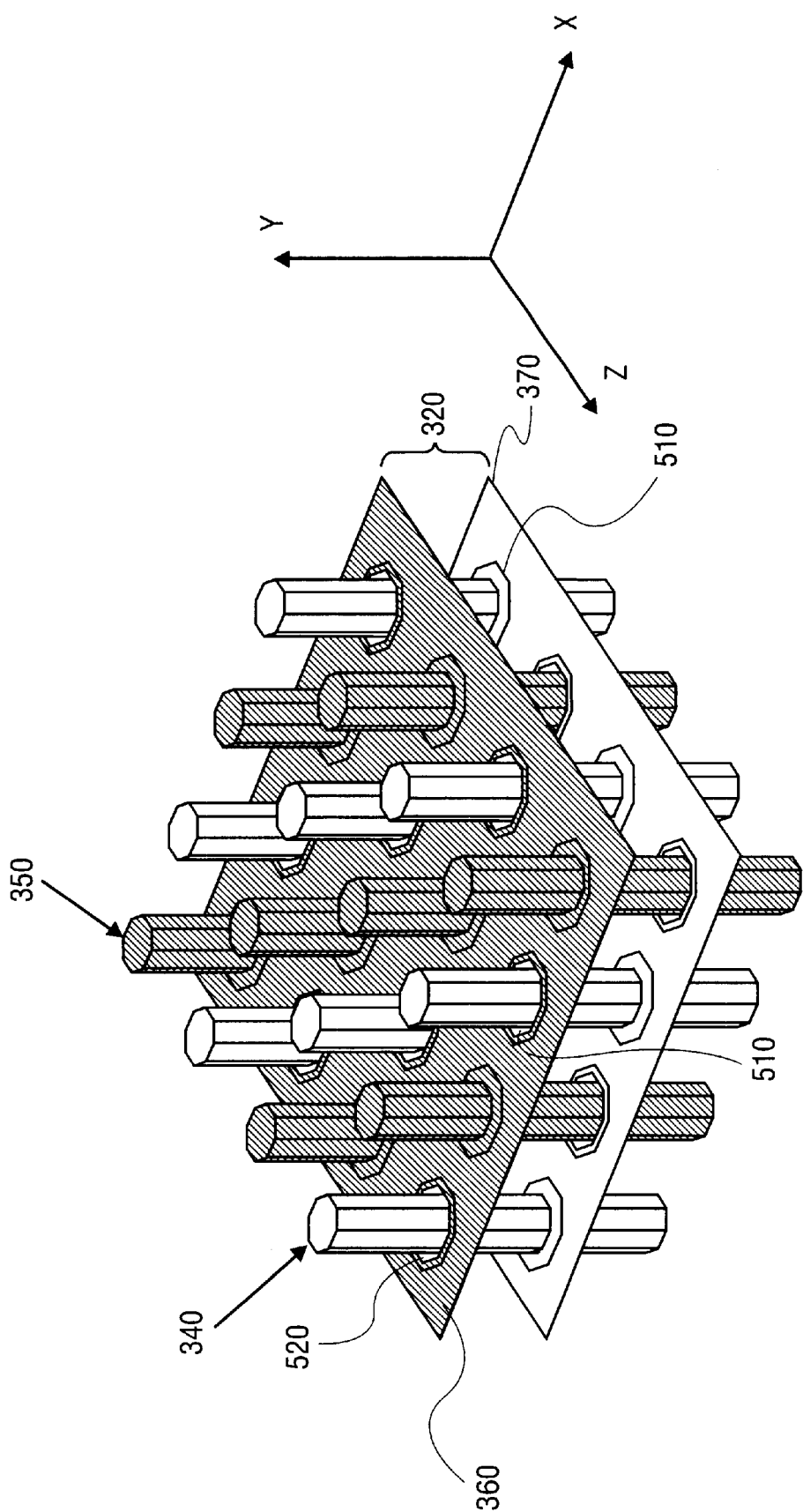
FIG. 6 illustrates a top perspective view of a portion of the test contactor of FIG. 4 and shows a power plane and power pins extending therethrough.

FIG. 5 and FIG. 6 illustrate top perspective views of test contactor 305 with the contactor body or PCB 320 removed and only a ground plane and a power plane shown of the test contactor, respectively. FIG. 5 further shows ground pins extending therethrough with power pins shown in ghost lines. FIG. 6 reverses the view showing power pins extending through the test contactor and ground pins shown in ghost lines.

Figure 7:
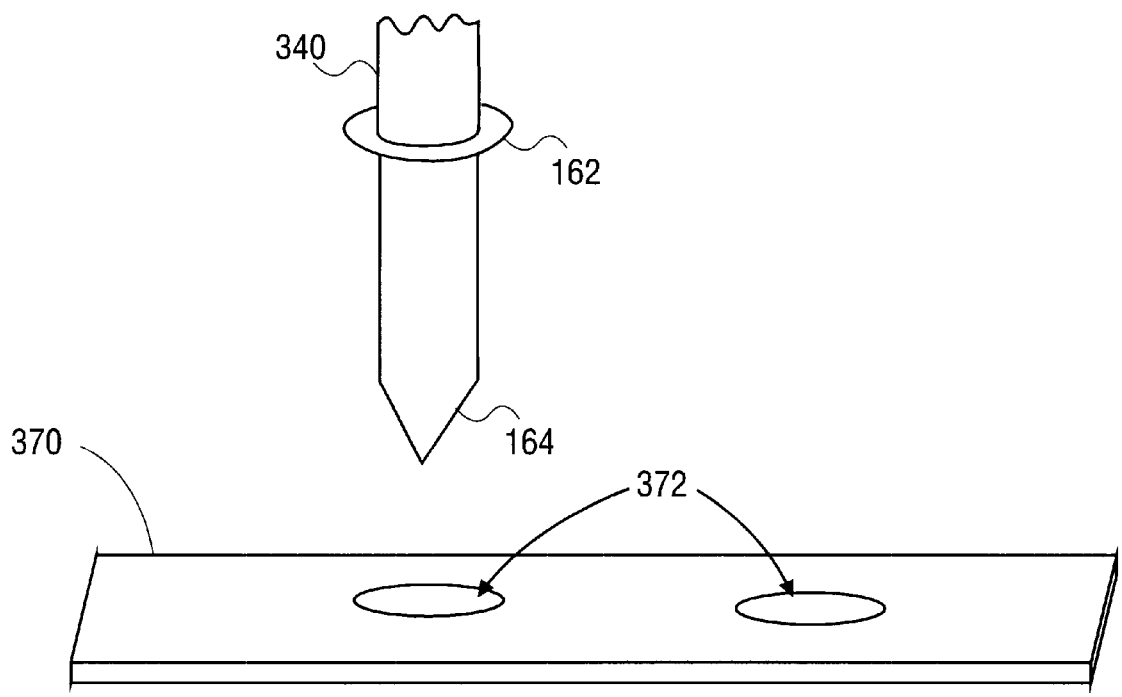
FIG. 7 illustrates an exploded perspective view of a single ground pin above a portion of a ground plane.
Figure 8:
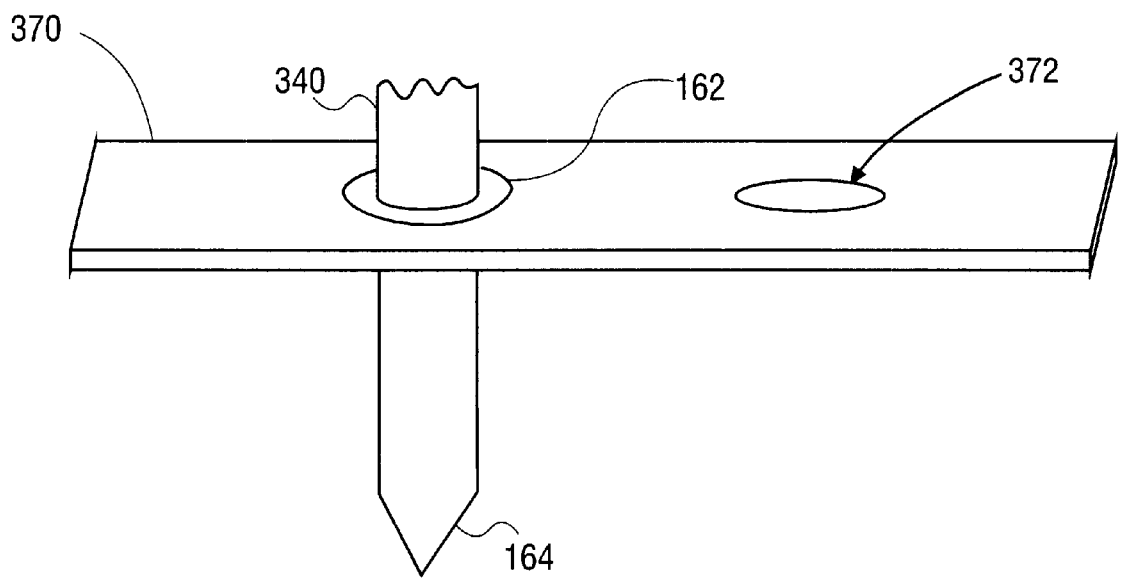
FIG. 8 illustrates an exploded perspective view of the ground pin of FIG. 7 coupled to the ground plane.

Referring to FIG. 5, ground pins 340 are disposed through PCB 320 in one embodiment and coupled to ground plane 370. One way this is accomplished is by coupling ground pin 340 to ground plane 370 as illustrated more specifically in FIG. 7 and FIG. 8. In FIG. 7, ground pin 340 includes lip 162 and beveled distal tip 164. Lip 162 of ground pin 340 comprises a conductive material and has an outside diameter greater than aperture 372 such that ground pin 340 fits securely in aperture 372 thus establishing an electrical connection with ground plane 370. Ground pin 340 is shown above aperture 372 in ground plane 370 prior to inserting ground pin 340 into ground plane 370. FIG. 8 shows ground pin 340 electrically coupled to ground plane 370 through lip 162.

Figure 9:
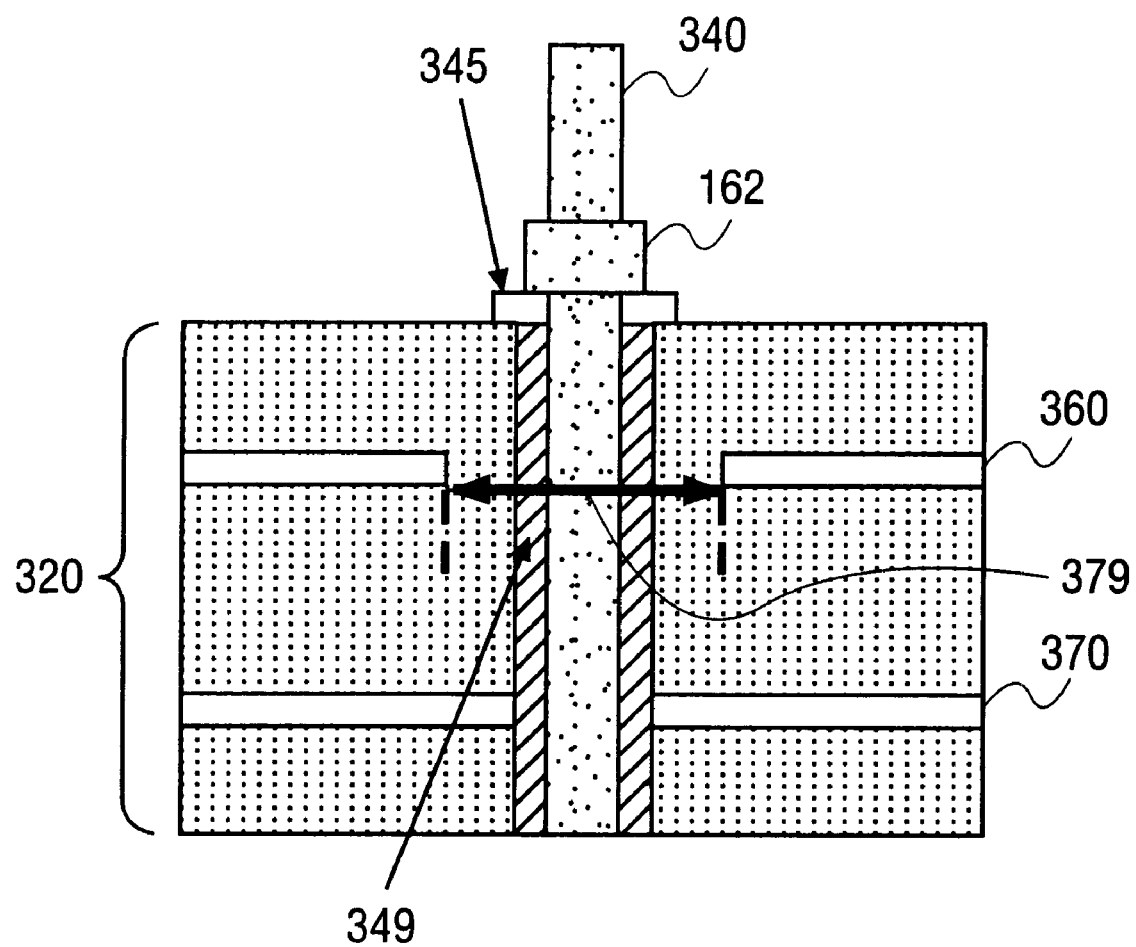
FIG. 9 illustrates a cross-sectional view of a ground pin extending through a power plane and coupled to a ground plane of a test contactor.

FIG. 9 illustrates a magnified cross-sectional view of ground pin seated in or coupled to ground plane 370. Referring to FIG. 9, ground pin 340 is seated on component pad 345 that contacts liner 349 disposed through ground plane 370. Component pad 345 typically comprises a metal such as nickel plated with gold. Liner 349 is, for example, a plated material such as a conductive material of gold, aluminum, or other suitable material.

While ground pins 340 are electrically connected to ground plane 370, ground pins 340 are not electrically connected to power plane 360. Referring to FIG. 5, ground pins 340 are placed through apertures 520 in power plane 360. Apertures 520 in power plane 360 for ground pins 340 have an increased diameter that prevent ground pins 340 from contacting power plane 360. For a ground pin, such as ground pin 340, having an outside diameter of 0.65 mm. One example of an increased diameter of an aperture such as aperture 379, illustrated respectively in FIG. 9 is about 42 mils±2 mils. Aperture 379 is an opening or via (formed, for instance, by an etching process during the fabrication of PCB 320) of a diameter larger than the outside diameter of ground pin 340 such that the clearance in power plane 360 prevents ground pin 340 from connecting with power plane 360. Alternatively, an aperture may have a diameter larger than the outside diameter of ground pin 340, with a dielectric material such as a polyimide selectively introduced along the edges of the aperture such that ground pin 340 is not electrically connected to power plane 360. The amount of dielectric material may be that amount that prevents ground pin 340 from connecting with power plane 360 but still allows a sufficient diameter for ground pin 340 to be inserted therethrough. FIG. 5 also shows power pin 350 extending through and not contacting ground plane 370 through the use of an increased diameter such as aperture 510 that exists in ground plane 370.

FIG. 6 shows power pins 350 extending through PCB 320 and electrically connected to power plane 360. In this illustration, power pins 350 are not electrically connected to ground plane 370. Power pins 350 are inserted through apertures 510 in ground plane 370 having a diameter large enough so that power pins 350 do not electrically contact ground plane 370. Apertures 510 of ground plane 370 may have about the same or similar dimensions as apertures 520 in power plane 360. Additionally, though not shown, signal pins have apertures formed for both power plane 360 and ground plane 370.

Figure 10:
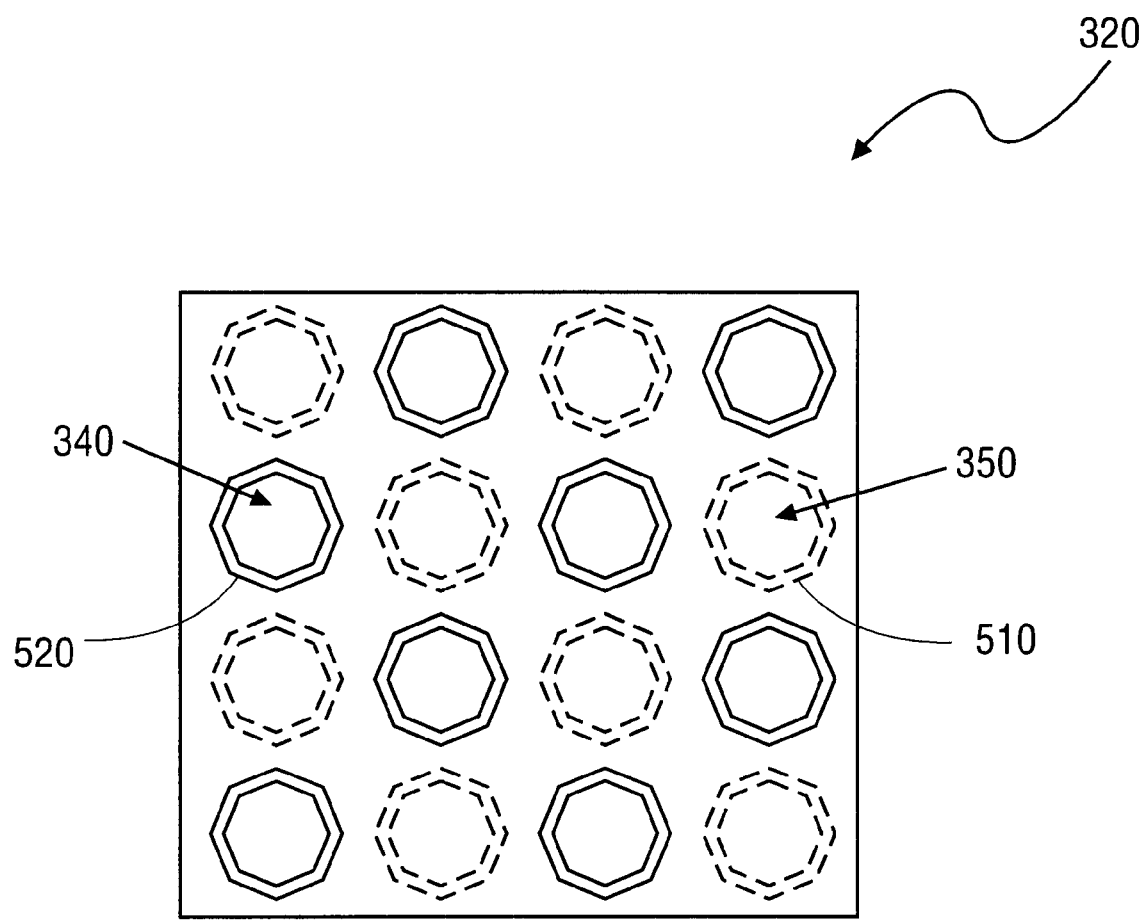
FIG. 10 illustrates a magnified top planar of a portion of the test contactor of FIG. 4 showing pins disposed through apertures.

FIG. 10 illustrates a top perspective view of an embodiment of a portion of PCB 320 of test contactor 305. As illustrated, ground pins 340 are disposed through apertures 520 located in power plane 360 that prevent ground pins 340 from contacting power plane 360. Similarly, power pins 350 are disposed through apertures 510 located in ground plane 370 that prevent power pins 350 from contacting ground plane 370. In FIG. 10, ghost lines used in apertures 510 represent apertures 510 as not being located on the same plane as apertures 520.

By placing one or more capacitors, such as surface mount technology (SMT) capacitors, onto a test contactor housing that includes a PCB, increased physical closeness (spacing) between the capacitor(s) and the electronic device to be tested may be achieved. This allows the power distribution loop area to be decreased which reduces the impedance and thus the bypass noise. Additionally, the capacitor response time is also reduced against a sudden demand of the current.

Figure 11:
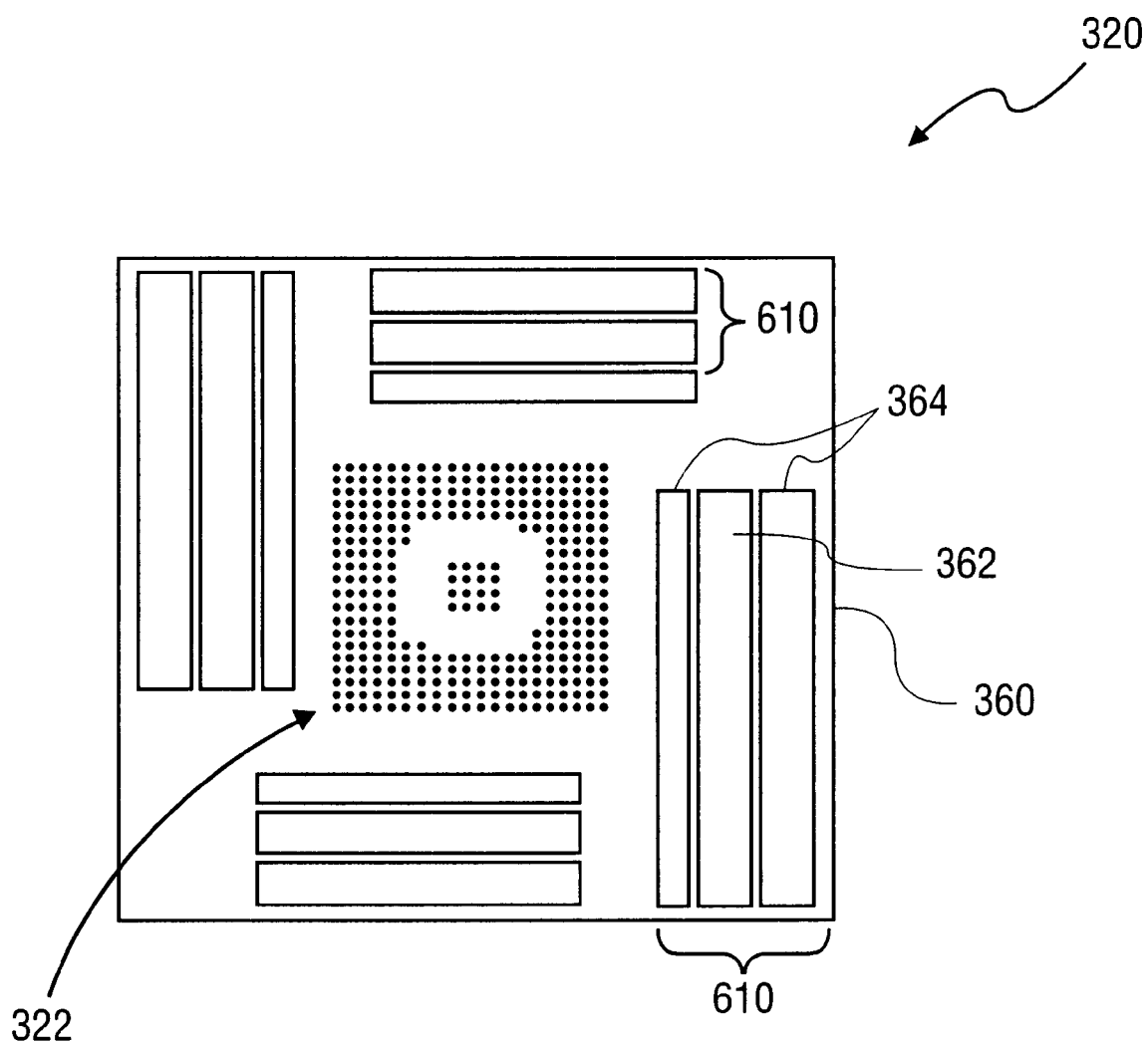
FIG. 11 illustrates a top planar view of the test contactor of FIG. 4 showing capacitor pads about the periphery.

FIG. 11 illustrates a top perspective view of PCB 320 showing device footprint area 322. Additionally, PCB 320 includes four capacitor pads 610 configured to hold capacitors, e.g., 20 surface mount technology (SMT) capacitors, placed on the periphery of PCB 320 that is attached to test contactor housing 310. In one embodiment, each capacitor pad 610 includes at least one ground pad 362 and at least one power pad 364. In another embodiment, each capacitor pad 610 includes ground pad 362 located between two power pads 364. In yet another embodiment, each capacitor pad 610 may include a plurality of ground pads 362 and a plurality of power pads 364.

The enhanced decoupling capability due to the placement of capacitors on the PCB 320 also decreases the number of decoupling capacitors in the test interface unit 270. By having fewer decoupling capacitors, the cost of the test tools such as the test interface unit 270 and the test contactor 305 is reduced. This also allows the test interface unit 270 to have a greater amount of space to place additional elements in the test interface unit 270.

Figure 12:
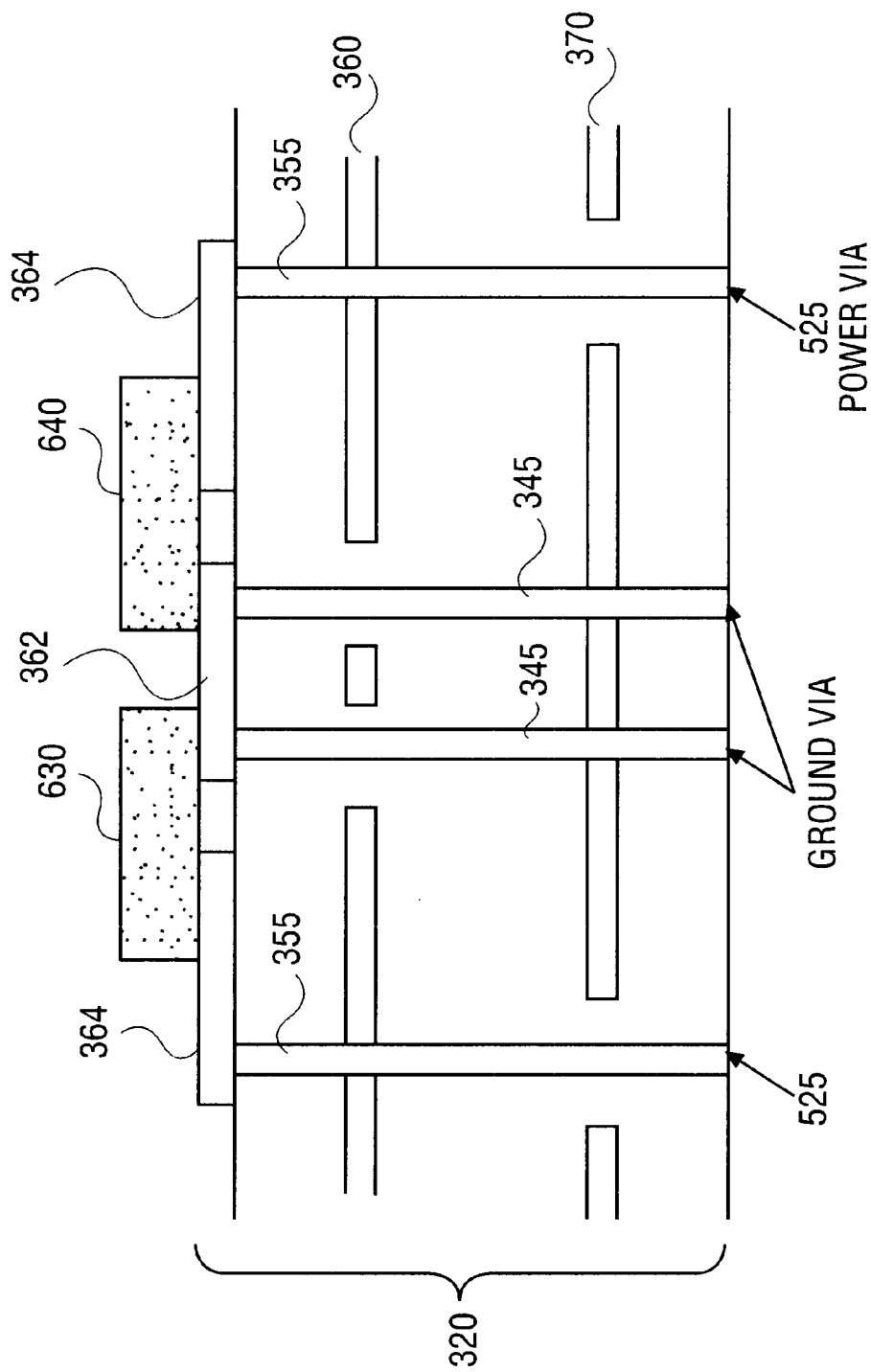
FIG. 12 illustrates a cross-sectional side view of a portion of the test contactor of FIG. 4 and shows capacitors located on a capacitor pad.

In one embodiment, power pad 364 provides a path that links the power terminal of the SMT capacitor to power plane 360 through conductive via 355 in aperture 525 shown in FIG. 12 (a magnified cross-section of a portion of PCB 320). Power pad 364 is connected to power plane 360 through conductive via 355. In contrast, ground pad 362 shorts the ground terminal of the SMT capacitor to ground plane 370. Ground pad 362 is connected to ground plane 370 through conductive via 345.

FIG. 12 further illustrates a cross-sectional view of capacitors located on PCB 420. Capacitors 630 and 640, arranged in parallel in one embodiment, act as a charge reservoir to react to any sudden demand of current from the electronic device being tested. In this configuration, capacitors 630 and 640 reduce the variations that occur from an external power source.

Figure 13:
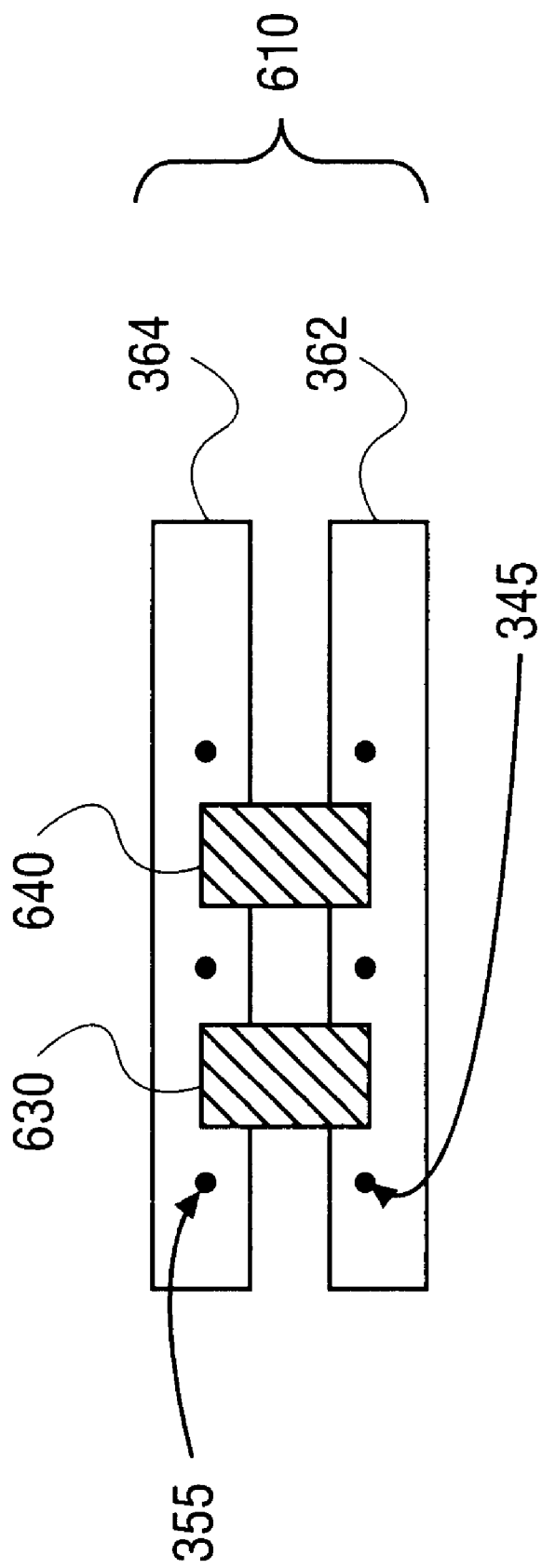
FIG. 13 illustrates a magnified top planar view of two capacitor pads on the test contactor of FIG. 4.

FIG. 13 illustrates a top perspective enlarged view of one capacitor pad 610 on PCB 320 coupled to test contactor housing 310. Capacitors 630 and 640 are shown to be coupled to ground pad 362 and to power pad 364 through conductive vias 345 and 355, respectively.

Figure 14:
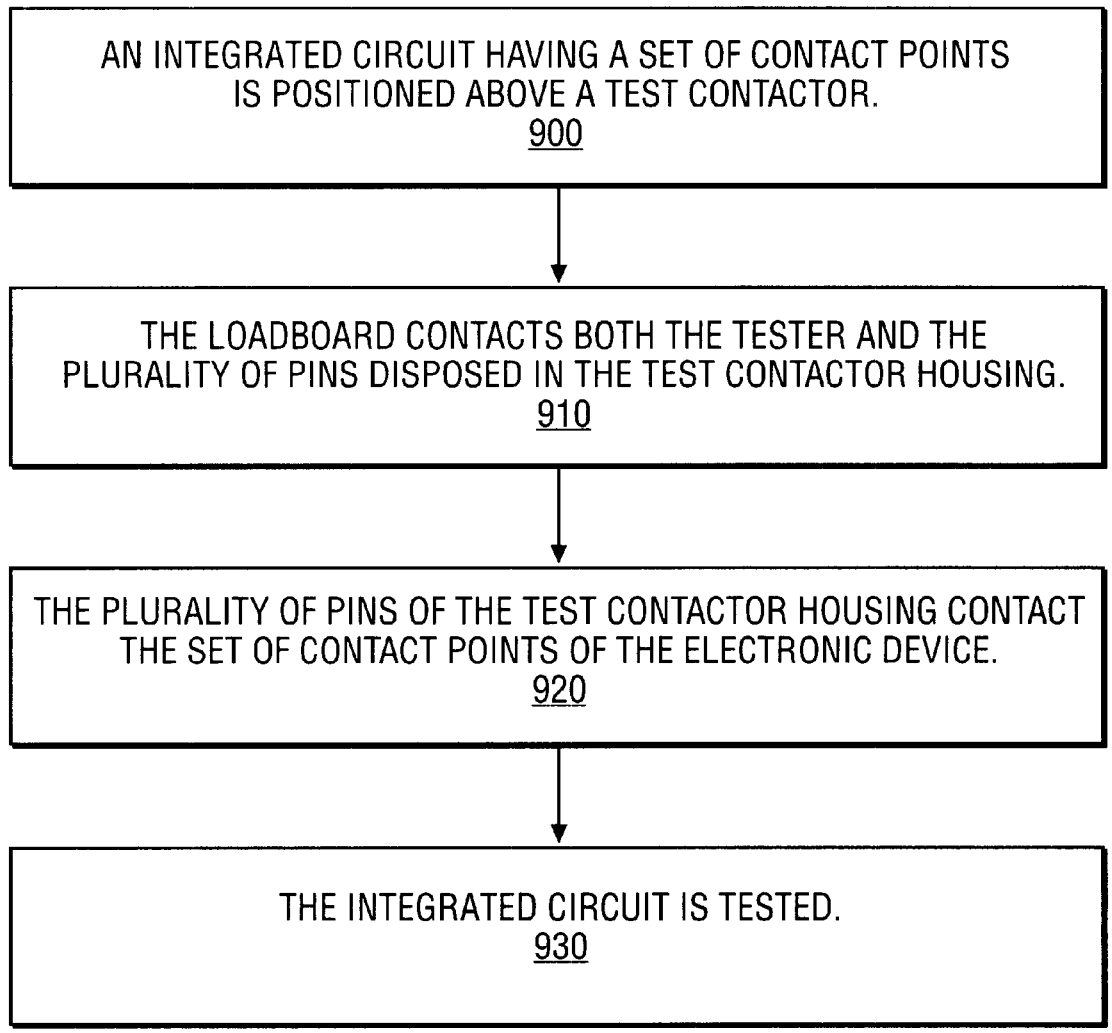
FIG. 14 illustrates a flow diagram for using a test contactor on a printed circuit board.

FIG. 14 illustrates a flow diagram for an embodiment of a test contactor such as described. At block 900, an integrated circuit having a set of contact points is positioned above a test contactor. At block 910, the loadboard contacts both the tester and the plurality of pins (e.g., ground pins, power pins, and signal pins) disposed in the test contactor housing. Embedded into the test contactor are the power and ground planes of the PCB. Additionally, SMT capacitors are located on the periphery of the PCB. At block 920, the plurality of pins of the test contactor housing contact the set of contact points of the electronic device. At block 930, the integrated circuit is tested.

By incorporating a power plane and a ground plane into the housing of a test contactor and possibly incorporating capacitors into the test contactor housing, voltage drops in pin addressing may be reduced. Longer pins (e.g., lengths of 7.8 mm or greater) may be used that generally have greater reliability and an extended lifetime than current state-of-the-art reduced-size (e.g., 3.5 mm) pins. By using these longer pins, the cost of the test contactor may also be reduced. The reduced voltage drop also tends to speed device testing.

Given the description provided above, studies show that the test contactor has improved performance over conventional test contactors. For example, in one study, the test contactor achieved higher capacitance than conventional test contactors as illustrated in Table 1. Higher capacitance is desirable for both the power and ground pin configurations so there is sufficient voltage for each pin when signaled. In this study, a three dimensional parameter extractor commercially available from Ansoft Corporation located in Pittsburgh, Pa. was used to extract inductive resistance capacitance (LRC) parasitic (mutual coupling from neighboring pins) of the test contactor in comparison with a conventional test contactor. Extractions were performed for two different power-ground pin configurations of each type of test contactor consisting of eight power pins and eight ground pins. The field solver extraction provided 8×8 IRC matrices for each power pin and ground pin configuration.

Referring to Table 1, the capacitance of the test contactor is much higher compared to conventional test contactors. For example, the test contactor of the claimed invention has $8.7 \times 10^{-13}$ farads (F) compared to the capacitance $5.3 \times 10^{-13}$ F of the conventional test contactor.

TABLE 1

Equivalent Per Pin IRC Parasitic of A Conventional Test Contactor and A Test Contactor

| Type | Power pin/ ground pin Configuration | Cself (Self capacitance in farads) | Leffective (effective inductance in henrys) | Reffective (effective resistance in ohms) |
|---|---|---|---|---|
| Conventional test contactor | Interdigitated | 5.30E-13 | 1.39E-09 | 1.22E-02 |
| | Side | 2.00E-13 | 4.581E-09 | 2.09E-02 |
| Test contactor implementing techniques of the invention | Interdigitated | 8.70E-13 | 1.41E-09 | 1.38E-02 |
| | Side | 6.60E-13 | 4.564E-09 | 2.57E-02 |

In the specification, the invention is described with reference to specific embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. An apparatus comprising:
   a housing having a plurality of test contactor pins extending therethrough, the plurality of test contactor pins comprising a set of power pins, a set of ground pins and a set of signal pins;
   a printed circuit board attached to the housing and having a first ground plane and a first power plane;
   wherein the set of power pins are electrically coupled to the first power plane and the set of ground pins are electrically coupled to the first ground plane, wherein the set of power pins, the set of ground pins and the set of signal pins extend through the printed circuit board.

2. The apparatus of claim 1, further comprising:
   at least one capacitor coupled to the printed circuit board.

3. The apparatus of claim 1, wherein the printed circuit board further includes a second power plane and a second ground plane.

4. An apparatus comprising:
   a tester;
   a housing having a plurality of test contactor pins extending therethrough, said plurality of test contactor pins comprising a set of power pins, a set of ground pins and a set of signal pins;
   a printed circuit board attached to the housing having a first ground plane and a first power plane;

wherein the set of power pins are electrically coupled to the first power plane and the set of ground pins are electrically coupled to the first ground plane, wherein the set of power pins, the set of ground pins and the set of signal pins extend through the printed circuit board; and a loadboard electrically coupling the plurality of test contactor pins to the tester.

5. The apparatus of claim 4, further comprising:

at least one capacitor coupled to the housing and the printed circuit board.

6. The apparatus of claim 4, wherein the printed circuit board includes a second power plane and a second ground plane.

7. A method comprising:

attaching a printed circuit board having a first power plane and a first ground plane to a housing;

inserting a plurality of test contactor pins through apertures in the housing and the printed circuit board, the plurality of test contactor pins comprising a first set of power pins, a second set of ground pins, and a third set of signal pins;

electrically coupling the power pins to the first power plane; and electrically coupling the ground pins to the first ground plane.

8. The method of claim 7, further comprising:

coupling a second power plane to the first ground plane.

9. The method of claim 8, further comprising:

coupling a second ground plane to the second power plane.

10. The method of claim 7 further comprising:

coupling at least one capacitor to the printed circuit board.

11. A method comprising:

attaching a printed circuit board having a first power plane and a first ground plane to a housing;

inserting a plurality of test contactor pins through apertures in the housing and the printed circuit board, the plurality of test contactor pins comprising a set of power pins, a set of ground pins, and a set of signal pins;

electrically coupling the power pins to the first power plane and coupling electrically the ground pins to the first ground plane; and coupling the plurality of test contactor pins to a tester with a loadboard.

12. The method of claim 11, further comprising:

coupling a second power plane to the first ground plane.

13. The method of claim 12, further comprising:

coupling a second ground plane to the second power plane.

14. The method of claim 11, further comprising:

coupling at least one capacitor to the housing.

15. The method of claim 11, further comprising:

coupling the at least one capacitor to one of the first power plane and the first ground plane.

* * * * *